US009077530B2

(12) United States Patent
Larsson

(10) Patent No.: US 9,077,530 B2
(45) Date of Patent: Jul. 7, 2015

(54) METHOD AND ARRANGEMENT FOR CONVEYING ADDITIONAL BITS IN A COMMUNICATION SYSTEM

(75) Inventor: Erik Larsson, Linköping (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 73 days.

(21) Appl. No.: 13/381,612

(22) PCT Filed: Oct. 18, 2011

(86) PCT No.: PCT/SE2011/051246
§ 371 (c)(1),
(2), (4) Date: Apr. 21, 2012

(87) PCT Pub. No.: WO2013/058686
PCT Pub. Date: Apr. 25, 2013

(65) Prior Publication Data

US 2013/0094605 A1  Apr. 18, 2013

(51) Int. Cl.
*H04L 27/00* (2006.01)
*H04L 1/16* (2006.01)
*H03M 13/35* (2006.01)
*H03M 13/47* (2006.01)
*H03M 13/00* (2006.01)
*H04L 1/00* (2006.01)
*H04L 1/18* (2006.01)
*H03M 13/11* (2006.01)
*H03M 13/23* (2006.01)
*H03M 13/27* (2006.01)
*H03M 13/29* (2006.01)

(52) U.S. Cl.
CPC ............ *H04L 1/1664* (2013.01); *H04L 1/0057* (2013.01); *H04L 1/0059* (2013.01); *H04L 1/1812* (2013.01); *H03M 13/1102* (2013.01); *H03M 13/23* (2013.01); *H03M 13/27* (2013.01); *H03M 13/2957* (2013.01); *H03M 13/356* (2013.01); *H03M 13/47* (2013.01); *H03M 13/6306* (2013.01); *H03M 13/6513* (2013.01)

(58) Field of Classification Search
None
See application file for complete search history.

(56) References Cited

U.S. PATENT DOCUMENTS 5,771,288 A * 6/1998 Dent et al. ............. 380/270
2008/0307284 A1  12/2008 Aghili et al.
2009/0158112 A1* 6/2009 Oh et al. ................ 714/752

FOREIGN PATENT DOCUMENTS

WO  2008/121299 A2  10/2008
WO  2009/099301 A2  8/2009

OTHER PUBLICATIONS

EPO, Int'l Search Report in PCT/SE2011/051246, Jun. 15, 2012.
EPO, Written Opinion in PCT/SE2011/051246, Jun. 15, 2012.

* cited by examiner

*Primary Examiner* — Adolf Dsouza
(74) *Attorney, Agent, or Firm* — Patent Portfolio Builders PLLC

(57) ABSTRACT

Methods and nodes in a communication system for conveying N additional bits with a block of data. A method in an encoding node involves determining the respective value of the N additional bits, and selecting a code based on the N values. The block of data is then encoded by use of the selected code. A method in a decoding node involves determining which code, from a predetermined set of candidate codes associated with different possible combinations of values of the N additional bits, that was used for encoding the block of data. The respective values of the N additional bits are then determined based on the determined code. The methods and nodes enable that the N additional bits may be conveyed and determined in the decoding node in an efficient way, without decoding the block of data and at low computational complexity.

25 Claims, 7 Drawing Sheets

METHOD AND ARRANGEMENT FOR CONVEYING ADDITIONAL BITS IN A COMMUNICATION SYSTEM

TECHNICAL FIELD

The invention relates generally to encoding of information to be transmitted in a communication system.

BACKGROUND

Typically, information to be transmitted in a communication system is arranged in relatively large blocks of data before being encoded and transmitted. A data block could comprise e.g. some hundreds or thousands of bits. Such a block is typically encoded in a transmitting node, by use of a code, which is known to a receiving node. The encoded block is then decoded in a receiving node using the known code.

In some applications, it is sometimes desired to convey information consisting of e.g. only one bit, not belonging to a regular block of e.g. payload data. Such an occasional additional lonely bit is then multiplexed with, e.g. inserted between, coded blocks of data. The long blocks of data are typically protected by a powerful error-correcting code, while an additional lonely bit is transmitted separately using a repetition code. For example, in LTE, HARQ ACKs, which may consist of one bit, are multiplexed with blocks of payload data.

An additional lonely bit can be jointly encoded with a data block, and thus also be encoded using e.g. an error correcting code. However, there are at least two reasons for that an additional lonely bit, such as the HARQ ACK bit in LTE, is not jointly encoded with blocks of e.g. payload data. Firstly, it may be desired to detect the lonely bit without decoding the whole data block, which is computationally costly. Secondly, it may be desired to protect the additional lonely bit against error more heavily than the block of payload data, so that the lonely bit can be detected with a smaller error probability than the BER (Block Error Rate) of the payload data.

The problem of multiplexing an additional lonely bit with blocks of payload data is that it is costly to protect the lonely bit against channel noise. This can be understood and quantified as follows. On a (real-valued) AWGN channel with noise variance No/2 and transmit power P (per dimension), bits can be conveyed at a spectral efficiency of:

$$\beta = \frac{1}{2}\log_2\left(1 + \frac{P}{N_0/2}\right) \text{ bits/channel use} \quad (1)$$

Beta represents the number of information bits that may be conveyed per symbol or channel use. If K out of N channel uses are used for transmitting an additional lonely bit by use of repetition coding, where the additional lonely bit is repeated K times, the spectral efficiency of the payload transmission would be reduced to:

$$\beta' = \frac{1}{2}\left(1 - \frac{K}{N}\right)\log_2\left(1 + \frac{P}{N_0/2}\right) < \beta \quad (2)$$

In order to restore spectral efficiency from β' to β, the transmit power P would need to be increased, to P', where P' satisfies:

$$\beta = \frac{1}{2}\left(1 - \frac{K}{N}\right)\log_2\left(1 + \frac{P'}{N_0/2}\right) \quad (3)$$

Solving (1) and (3) for P and P', respectively, as functions of β, and computing the ratio P'/P yields:

$$\Delta_P \triangleq \frac{P'}{P} = \frac{2^{\frac{2\beta}{1-K/N}} - 1}{2^{2\beta} - 1} \quad (4)$$

Delta P, $\Delta_P$, represents the increase in transmit power which is needed to maintain the same spectral efficiency as in an original system, when introducing an additional lonely bit, encoded with a repetition code, which consumes payload resources. Equivalently, in decibel:

$$10\log_{10}(\Delta_P) = \quad (5)$$
$$10\log_{10}\left(2^{\frac{2\beta}{1-K/N}} - 1\right) - 10\log_{10}(2^{2\beta} - 1) \approx 6.0 \cdot \frac{1}{1 - 2^{-2\beta}} \cdot \frac{K}{N} \text{ dB}$$

Thus, for example, for N=200, K=10, and a target spectral efficiency of β=0.5 bpcu, the power increase, $\Delta_P$, needed in order to maintain the same spectral efficiency (as before introduction of an additional bit) is 0.3 dB. It should be noted that these formulas are only asymptotically valid (N→∞ and K<<N) and represent approximations for finite N.

A question of interest is whether there is any way of conveying the additional lonely bit without incurring the power cost of $\Delta_P$.

SUMMARY

It would be desired to enable conveying of an additional lonely bit without incurring the power cost of $\Delta_P$, as described above. It is an objective of the invention to enable conveying of an additional lonely bit with a power cost that is substantially lower than $\Delta_P$.

In the embodiments below, N is an integer ≥1, and an additional bit is a binary digit which may assume the values zero or one.

According to a first aspect a method in a communication system is provided for conveying N additional bits with a block of data to be encoded and transmitted. The method comprises actions both in an encoding node and in a decoding node. In the encoding node, the respective value of the N additional bits is determined, and a code is selected based on the N values. The block of data is encoded by use of the selected code. In the decoding node, the method comprises determining which code, from a predetermined set comprising $2^N$ candidate codes associated with different possible combinations of values of the N additional bits, that was used for encoding the block of data. The respective values of the N additional bits are determined based on the determined code.

According to a second aspect, a method is provided in an encoding node in a communication system, for conveying N additional bits with a block of data to be encoded and transmitted. The method comprises determining the respective value of the N additional bits and selecting a code based on the N values. The method further comprises encoding the block of data by use of the selected code.

According to a third aspect, an encoding node in a communication system is provided for conveying N additional bits with a block of data to be encoded and transmitted. The encoding node comprises a functional unit adapted to determine the respective values of the N additional bits. The encoding node further comprises a functional unit adapted to select a code based on the N values, and a functional unit adapted to encode the block of data by use of the selected code.

According to a fourth aspect, a method is provided in a decoding node in a communication system, for conveying N additional bits with a block of data to be encoded and transmitted. The method comprises determining which code that was used for encoding the block of data. The determined code is a code from a predetermined set comprising candidate codes associated with different possible combinations of values of the N additional bits. The method further comprises determining respective values of the N additional bits based on the determined code.

The above described methods and nodes may be used for conveying one or more additional bits with a data packet for practically no cost in terms of radio resource consumption or computational complexity, as compared to conventional methods. Further, the data packet does not need to be decoded in order to determine the additional bits which are conveyed with the packet. This is especially advantageous for e.g. control information, such as e.g. HARQ-related information.

The above method and network node may be implemented in different embodiments. The predetermined set may comprise $2^N$ codes, each associated with a respective combination of values of the N additional bits. Regarding the codes in the predetermined set of codes, one code could be obtained e.g. by permuting the bits of the codewords of another code. The additional bits to be conveyed may be related e.g. to control information, such as acknowledgements in an automatic repeat request procedure.

The determining (in the decoding node) of the code used may involve, apart from obtaining a block of data encoded with an unknown code from a predetermined set of codes, also calculating the respective posterior probabilities that a set of syndrome checks are satisfied, given the obtained block of data, said syndrome checks being associated with a code candidate from the set of codes. Further, the posterior probabilities may be combined in different ways. For example, the logarithms of the posterior probabilities for each individual syndrome check may be added. The posterior probabilities may be combined e.g. per code candidate, when posterior probabilities are calculated for syndrome checks associated with one or more further code candidates. It may be determined which one of the code candidates that was used for encoding the obtained data, based on a comparison between the combined posterior probabilities associated with each code candidate. Further, the encoded data block may be decoded in the decoding node.

The embodiments above have mainly been described in terms of a method. However, the description above is also intended to embrace embodiments of the network node and base station, configured to enable the performance of the above described features. The different features of the exemplary embodiments above may be combined in different ways according to need, requirements or preference.

BRIEF DESCRIPTION OF THE DRAWINGS

The invention will now be described in more detail by means of exemplifying embodiments and with reference to the accompanying drawings, in which.

DETAILED DESCRIPTION

Figure 1:
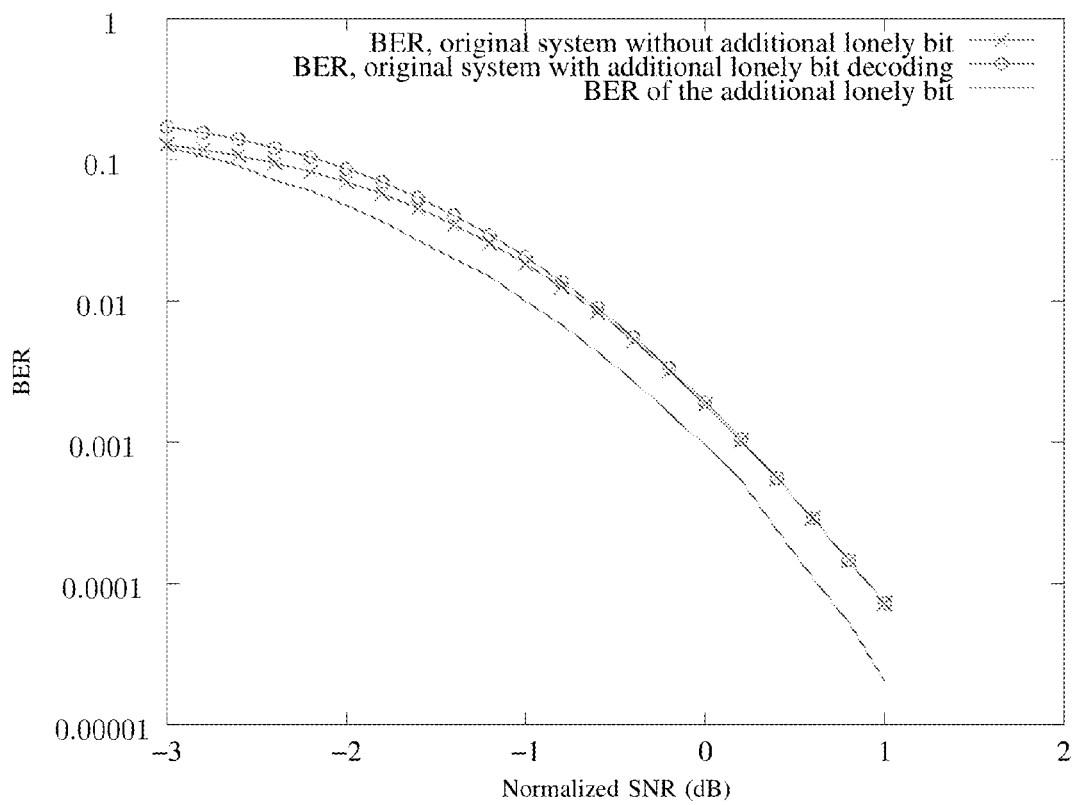
FIG. 1 is a graph showing the result of simulations of a communication when applying an exemplifying embodiment.

Briefly described, a scheme is provided, by which an additional lonely bit, such as e.g. a HARQ ACK bit, can be piggybacked on a payload data packet, e.g. over a wireless link, at no cost in transmit power or bandwidth, and yet be detected with very high reliability at a receiver of the payload data packet, without decoding of the data packet.

One possible implementation of the scheme described herein, is to augment the original codeword space of a code used for encoding data packets with a permuted version of itself, and thus create a new, nonlinear code, which has the properties that (i) the additional lonely bit can be easily detected and (ii) the payload data can be efficiently decoded.

Below, an exemplifying embodiment will be described, for transmission or conveying of one additional bit with a data packet comprising payload. In order to describe the scheme in more detail, some adequate notation is needed. Let Π be a payload message. Let $C_1$ and $C_2$ be two randomly chosen channel codes of length M. In practice, the channel codes could be two random instances of an LDPC code with given degree distributions, or, they could be obtained by permuting the bits of a standard code, e.g. convolutional, turbo or LDPC code, in two different ways. In performed simulations, an off-the-shelf LDPC code was selected as $C_1$, and $C_2$ was selected to be the same code as $C_1$, but with the bits rearranged so that if $\{c(1:M)\}$ are the codewords of $C_1$, then the codewords of $C_2$ are $\{c(M/2+1:M),c(1:M/2)\}$. In other words, to generate the codewords of $C_2$, take each codeword of $C_1$, split it in the middle, and swap the left and right halves.

The transmitter in this example operates as follows. Let b be the additional lonely bit. If b=0, then encode Π with $C_1$, and if b=1, then encode Π with $C_2$. Note that the respective codes $C_1$ and $C_2$ are linear, but, in general, the effective code, i.e. a code comprising the codewords of both $C_1$ and $C_2$ is non-linear.

Regarding the design of a receiver, it should be noted that b is unknown, so the decoding problem is more difficult than that in the conventional setup. By conventional setup is here meant that the channel code is known to the receiver in advance. Indeed, the receiver is required to:

i) detect b, preferably without decoding Π, and
ii) decode Π without necessarily knowing b. Tasks (i) and (ii) can be solved, as follows:
(i)

Essentially, the detection of b amounts to determining, or guessing, which code of $C_1$ or $C_2$, that was used to encode Π. Let $\{l_i\}_{i=1}^M$ be the log-likelihood ratios obtained at the output of a channel demodulator, i.e., $$l_i = \log\left(\frac{P(b_i = 1|\text{received\_data})}{P(b_i = 0|\text{received\_data})}\right),$$

where bi is the ith coded information bit.

Further, let $p_{ckl}$ be the index of the kth nonzero element of the lth row of the parity check matrix associated with the code $C_c$.

Compute the following quantities:

$$x_1 = \sum_r (\boxplus)_q l_{p1rq}$$

$$x_2 = \sum_r (\boxplus)_q l_{p2rq}$$

If $x_1 > x_2$, then decide that b=0, otherwise, conclude that b=1. Here, ⊞ (square with plus-sign inside) is Hagenauer's Boxplus operator, which may be computed or tabulated according to known methods. The number of terms required to compute $x_i$ is O(Md), where d is the maximum degree of the code. That is, the complexity of the operation of computing $x_i$ scales with M and d as M·d (M times d). For example, if d is doubled, the complexity is doubled, etc. For LDPC codes, d is typically less than 10. For convolutional codes, it is of the same order as the constraint length. Hence the computational complexity of this algorithm is not large.

(ii)

If b is known, this implies that the code used to encode the data block (and the additional bit) is also known, and thus the data block ⊓ could be decoded, as in the conventional system (without an additional lonely bit), by applying the known code. When b is unknown, and thus, consequently, the code used to encode the data block (and the additional bit) is unknown, both the $C_1$ and $C_2$ decoder may be run. By "Ci decoder" is here meant a decoder using the code Ci. It is very unlikely that both the $C_1$ and $C_2$ decoders will return a valid codeword; and hence, the output of the one decoder which returns a valid codeword should be selected. This double decoder solution would double the decoder complexity, as compared to the original system where the code is known to the receiving unit in advance. If a good guess of b, say b^, is available (such as that provided by step (i) above), an attempt to decode the data block using the decoder associated with b^, i.e. Cb^, could be made. If the decoder Cb^ converges, the output of the decoder may be used as the final result, i.e. the decoded block of data. Otherwise, the other decoder is used for decoding the data block.

Provided that b can be accurately determined by the method in (i), carrying out the decoding method described above essentially has the same complexity as the decoding in the original system.

Simulations have been performed in order to illustrate an exemplifying embodiment of the above described solution. The simulations concerned BPSK (Binary Phase Shift Keying) transmission over an AWGN channel. The codes to be used for encoding may be selected in many different ways. However, somewhat arbitrarily, in order to illustrate the principle, Cb=1 was selected as the rate-½ LDPC code 204.33.484 of D. MacKay's code database. (The code was also further optimized to remove cycles). As Cb=0 was selected the same code, but subjected to permutation or interleaving, as previously described. The choice of LDPC codes may be beneficial, since LDPC codes offer a natural possibility of error checking. However, error checking may also be achieved for other types of codes, e.g. by including a CRC check for this purpose. In the simulations, the payload blocks had 102 bits when uncoded and 204 bits when encoded. The LDPC decoder was configured to terminate after at most 10 iterations.

FIG. 1 illustrates the result of the simulations, and shows the following graphs: 1) The payload data BER of the original system, without transmitting the additional lonely bit (line with Xs); 2) The payload data BER of a system, using the proposed coding scheme (selecting C1 or C2 depending on b) with the proposed, associated decoder (line with circles). An important observation, which could be made from FIG. 1 is that: for BER values below 1%, no payload BER penalty of transmitting the additional lonely bit could be measured. That is, the BER of the blocks of payload data was just as good when the encoding of the blocks was used to convey an additional lonely bit, as when the code used to encode the blocks was known to the receiving node in advance (and not used to convey any additional lonely bit). Further, FIG. 1 shows the graph: 3) The error probability for the additional lonely bit, with the proposed scheme (solid line). In the simulations, the BER of the additional lonely bit was about half that of the payload BER.

If the error probability for a decoded additional bit in a receiving node is not satisfactory, the same bit could be encoded with more than one data packet. For example, the same additional bit could be encoded with/piggy-backed on 2-4 different data packets, and the results could be combined at a receiver. This way, a more accurate result could be achieved, having a lower error probability.

Above, the case where one additional lonely bit is to be conveyed is described. However, the described concept is equally applicable in situations where more than one additional bit is to be conveyed. The set of code candidates is then to be extended to comprise a number of codes which is $2^N$, where N is the number of additional bits to be conveyed with one block of data. The number N of bits could be e.g. 1, 2, 3, 4, 5, 6, or even higher. However, the higher number of additional bits, the higher error probability for the additional bits to be conveyed with the data block. The higher error probability is due to that the higher number, N, of additional bits, the higher number, $2^N$, of different codes representing the different combinations of values of the N additional bits. The more codes, the smaller distance between the different codes, the higher probability of mistaking one code for another, and thus higher error probability for the additional bits. Further, the error probability of the coded bits comprised in the data packet would also increase with an increased number of additional bits, for the same reasons.

Below, the principles of the decoding aspect of the solution described above will be described in further detail. The decoding scheme described below enables a fast mechanism for determining whether a certain channel code was used to encode a set of data or not. As described above, the decoding scheme and procedure is suitable for use where it should be determined which one out of a set of channel code candidates that was used for encoding a set of data, such as for detecting or decoding the value of an additional bit, which is piggy-backed with a block of data. The decoding scheme is further suitable for use e.g. in blind detection.

In the decoding scheme, a receiver does not need to receive the entire set or block of data to determine whether a certain code was used to encode the block, which is typically the case e.g. in blind detection. Further, the data need not be decoded in order to determine whether a certain channel code has been used or not. The decoding scheme is valid for all types of channel codes, for which syndrome checks may be formulated, e.g. any linear channel code.

Within the description of the decoding scheme below, the following notation will be used:

For a binary random variable X, the likelihood ratio of X is defined as:

$$L(X) = \frac{Pr(X = 0)}{Pr(X = 1)}.$$

Given another random variable Y, the conditional likelihood ratio of X given Y is defined as $$L(X\mid Y) = \frac{Pr(X=0\mid Y)}{Pr(X=1\mid Y)}.$$

Similarly, the Log-Likelihood Ratio (LLR) of X and the conditional log-likelihood ratio of X given Y are defined as $\Lambda(X)=\log(L(X))$ and $\Lambda(X\mid Y)=\log(L(X\mid Y))$, respectively.

Note that by the Bayes' rule, $$L(X\mid Y) = \frac{Pr(X=0\mid Y)}{Pr(X=1\mid Y)} =$$

$$\frac{Pr(Y\mid X=0)\frac{Pr(X=0)}{Pr(Y)}}{Pr(Y\mid X=1)\frac{Pr(X=1)}{Pr(Y)}} == \frac{Pr(Y\mid X=0)Pr(X=0)}{Pr(Y\mid X=1)Pr(X=1)} = L(Y\mid X)L(X)$$

and thus $\Lambda(X\mid Y)=\Lambda(Y\mid X)+\Lambda(X)$.

Therefore, if X is an equiprobable binary random variable, then $L(X)=0.5/0.5=1$ and thus $\Lambda(X\mid Y)=\Lambda(Y\mid X)$. Moreover, if $Y_1, Y_2, \ldots, Y_n$ are independent random variables, then, for an equiprobable binary random variable X:

$$\Lambda(X\mid Y_1, \ldots, Y_n) = \sum_{i=1}^{n} \Lambda(X\mid Y_i)$$

Assuming that $X_1, X_2, \ldots, X_n$ are binary random variables and $Y_1, Y_2, \ldots, Y_n$ are random variables and that $\oplus$ denotes the binary addition over $\mathbb{F}_2$ (the field of binary variables) it has been shown that:

$$\Lambda(X_1 \oplus \ldots \oplus X_n \mid Y_1, \ldots, Y_n) = \log\left(\frac{1+\prod_{i=1}^{n}\tanh\left(\frac{\ell_i}{2}\right)}{1-\prod_{i=1}^{n}\tanh\left(\frac{\ell_i}{2}\right)}\right) \quad (6)$$

where $l_i = \Lambda(X_i\mid Y_i)$. This operation is referred to as the "box-plus" operation and is denoted "$\boxplus$", that is, $$\boxplus_{i=1}^{n}\ell_i = \log\left(\frac{1+\prod_{i=1}^{n}\tanh\left(\frac{\ell_i}{2}\right)}{1-\prod_{i=1}^{n}\tanh\left(\frac{\ell_i}{2}\right)}\right)$$

Below, the proposed scheme will be described in further detail. Regarding the notation, $b_1, b_2, \ldots, b_M$ will denote the information bearing bits, and $c_1, c_2, \ldots, c_N$ will denote the corresponding coded bits obtained from the channel encoder (e.g. in a transmitting node). The coded bits are transmitted to a receiving node through a communication channel. The corresponding observed sequence at a receiver of the coded bits (e.g. in a receiving node) will be denoted $y_1, y_2, \ldots, y_N$. It is assumed that the channel code which is used by the channel encoder is unknown to the receiver. Thus, it is desired to determine, in the receiver, which channel code that was used by the channel encoder.

Equation (6), which is normally used e.g. for Low Density Parity Check (LDPC) decoding, may be applied in order to determine whether a specific code was used to encode a set of observed data or not. For any code, there will be parity check relations of the form:

$$c_{i_1} \oplus c_{i_2} \oplus \ldots \oplus c_{i_P} = 0$$

for some i and P. In general, for any convolutional code, these relations can be obtained using the syndrome former of the code, and for any block code, these relations may be obtained from the parity check matrix associated with the code. The syndrome former is defined for any convolutional code. It can be tabulated, and there are standard tools available for finding the syndrome former of a code.

Now, given that the communication channel, or propagation channel, is "good enough", i.e. that the received Signal to Noise Ratio (SNR) is high enough, e.g. above a certain threshold, then the "syndrome posterior probability"

$$\gamma_i \boxplus_{j=1}^{P} \Lambda(c_{i_j}\mid y_{i_j})$$

should be large. Hence, by collecting enough observations i and combining the corresponding conditional LLRs $\gamma_i$, it can be decided if a given code was used. Equation (6) can be efficiently implemented to calculate the conditional LLRs fast.

Below, the decoding scheme will be exemplified using a standard rate-½ convolutional code with constraint length 4, depicted in FIG. 2. This code will be denoted "the given code" or "the candidate code" in the example below.

Figure 2:
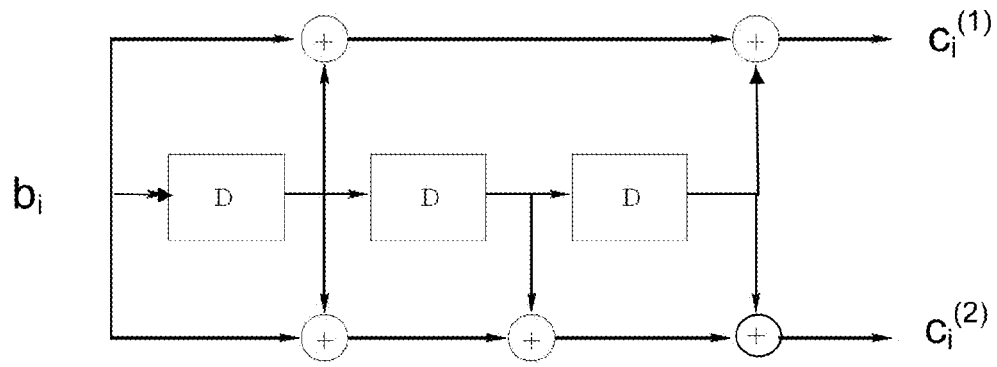
FIG. 2 illustrates a standard rate ½ convolutional code with constraint length 4. The generators for this code are g1=15 and g2=17 in octal.

At each time instant i, the output of the encoder shown in FIG. 2 is:

$$c_i^{(1)} = b_i \oplus b_{i-1} \oplus b_{i-3}$$

and:

$$c_i^{(2)} = b_i \oplus b_{i-1} \oplus b_{i-2} \oplus b_{i-3}$$

Using the syndrome former of the given code, it may be derived that, for this specific code:

$$c_{i-1}^{(2)} \oplus c_{i-1}^{(1)} \oplus c_i^{(1)} \oplus c_{i+1}^{(1)} \oplus c_{i+1}^{(2)} \oplus c_{i+2}^{(1)} \oplus c_{i+2}^{(2)} = 0 \quad (7)$$

Therefore, the syndrome posterior probability:

$$\gamma_i \triangleq l_{i-1}^{(2)} \boxplus l_{i-1}^{(1)} \boxplus l_i^{(1)} \boxplus l_{i-1}^{(1)} \boxplus l_{i+1}^{(2)} \boxplus l_{i+2}^{(1)} \boxplus l_{i+2}^{(2)} \quad (8)$$

where $l_i^{(j)} = \Lambda(c_i^{(j)}\mid y_i^{(j)})$, would most probably take on high values. It should be noted, that herein, the observed sequence y is labeled as:

$$y_1^{(1)}, y_1^{(2)}, \ldots, y_i^{(1)}, y_i^{(2)}, \ldots$$

rather than the conventional labeling (that is the sequence $y_1, y_2, \ldots$), in order to associate the observed sequence to the output of the encoder.

By observing, e.g. K pairs at the channel decoder, and calculating the vector of posterior probabilities, in this case log-likelihood probabilities, $\gamma = [\gamma_1, \gamma_2, \ldots, \gamma_K]^T$ it may be decided whether the channel encoder used the given convolutional code, i.e. the evaluated candidate code, to encode the data or not. In order to enable such a decision, the syndrome posterior probabilities may be combined in different ways, which will be exemplified below.

A simple exemplifying method to determine or decide whether a certain channel code candidate was used or not may be to compare the cumulative metric $$\gamma(K) \triangleq \sum_{i=1}^{K} \gamma_i$$

with a threshold, say η; as follows:

$$\gamma(K) \underset{H_0}{\overset{H_1}{\gtrless}} \eta \quad (9)$$

where the hypothesis $H_1$ may imply that the evaluated candidate code (i.e. the code associated with the derived syndrome) was used by the channel encoder, and correspondingly the hypothesis $H_0$ may imply that some other code was used by the channel encoder.

In the case where the value of an additional bit conveyed with an encoded block of data should be determined, the decision of which code that was used may be based on a comparison between the combined posterior probabilities of each code candidate. Syndrome checks associated with all the candidate codes could be evaluated, and the results could be compared. The posterior probabilities could be combined e.g. by adding the logarithms of the posterior probabilities for each individual syndrome check A statistical test based on the observed sequence $\gamma=[\gamma_1, \gamma_2, \ldots, \gamma_K]^T$ may be designed to determine whether a certain channel code candidate was used or not. For example, this may be done by approximating each γi with independent and identically distributed (i.i.d.) Gaussian random variables as:

$$\gamma_i \sim N(\lambda, \sigma_1^2), \text{ under } H_1, \text{ and}$$

$$\gamma_i \sim N(0, \sigma_0^2), \text{ under } H_0, \text{ for } i=1,2,\ldots,K \quad (10)$$

where $\lambda$, $\sigma_1^2$ and $\rho_0^2$ are unknown nuisance parameters of the statistical test.

The assumption of having i.i.d. distribution can be justified with increasing the interval between each observation. Now, the distribution of the observed vector y under the two hypotheses can be written as:

$$Pr_{\gamma|H_1}(\gamma|H_1) = \prod_{i=1}^{K} \frac{1}{\sqrt{2\pi}\sigma_1} \exp\left(-\frac{(\gamma_i - \lambda)^2}{2\sigma_1^2}\right), \text{ under } H_1, \quad (11)$$

and $$Pr_{\gamma|H_0}(\gamma|H_0) = \prod_{i=1}^{K} \frac{1}{\sqrt{2\pi}\sigma_0} \exp\left(-\frac{(\gamma_i)^2}{2\sigma_0^2}\right), \text{ under } H_0.$$

A Generalized Likelihood Ratio Test (GLRT) may be used to distinguish between $H_0$ and $H_1$, e.g. as:

$$\Delta(\gamma) = \frac{\max_{\lambda, \sigma_1} \gamma|H_1 (\gamma|H_1)}{\max_{\sigma_0} \gamma|H_0 (\gamma|H_0)} \underset{H_0}{\overset{H_1}{\gtrless}} \eta \quad (12)$$

A direct calculation shows that the GLRT test (12) can be expressed equivalently as:

$$\frac{\hat{\sigma}_0^2}{\hat{\sigma}_1^2} \underset{H_0}{\overset{H_1}{\gtrless}} \eta^{\frac{2}{K}} \quad (13)$$

where $$\hat{\sigma}_0^2 \triangleq \frac{1}{K} \sum_{i=1}^{K} \gamma_i^2$$

and $$\hat{\sigma}_1^2 \triangleq \frac{1}{K} \sum_{i=1}^{K} (\gamma_i - \hat{\lambda})^2$$

with $$\hat{\lambda} = \frac{1}{K} \sum_{i=1}^{K} \gamma_i$$

Consequently, the above described decoding scheme facilitates a fast blind detection of which channel code that was used for encoding e.g. a block or set of data. The described decoding scheme is efficient in terms of computational complexity. Moreover, the described algorithm does not require knowledge of the exact length of a coded block in advance.

Figure 3:
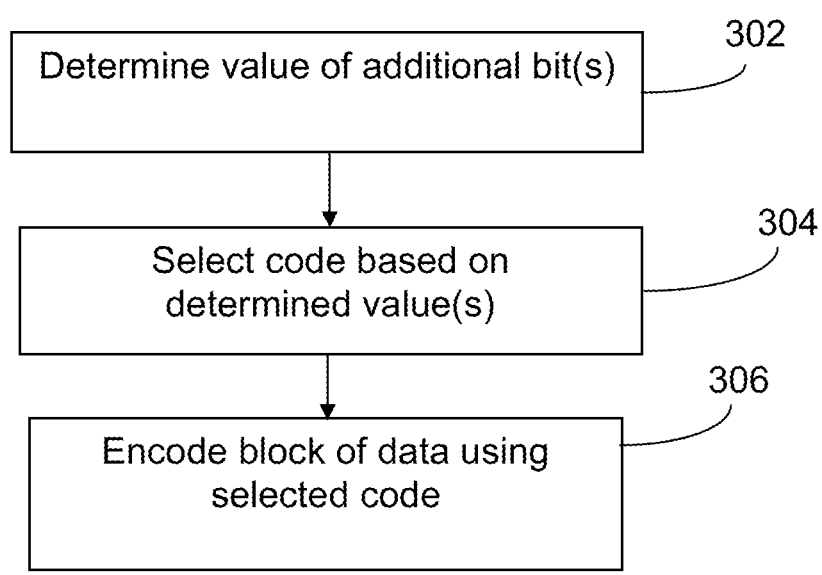
FIG. 3 is a flow chart illustrating actions in a procedure in an encoding node, according to an exemplifying embodiment.

Exemplifying Procedure, FIG. 3

An embodiment of the procedure, in an encoding node, of conveying N additional bits with a block of data, which is to be encoded and transmitted will now be described with reference to FIG. 3. The procedure could be performed in a transmitting node, such as e.g. a mobile terminal, or other communicating network node in a communication system.

Assuming a block of data, П, and N additional bits to be conveyed with the block of data П. The number N of additional bits is equal to or larger than 1, i.e. (N≥1). N is much smaller than the size of the block П, which may be e.g. some hundreds or thousands of bits. Each of the N additional bits is a binary digit, which may assume the value of zero or one. The N additional bits may be related to control signaling, such as e.g. information related to ARQ/HARQ.

The respective value of the additional N bits is determined in an action 302. For example, if N=2, the value of the first bit, b1, may be determined to 1, and the value of the second bit, b2, may be determined to 0. Based on the determined N values, a code to be used for encoding the data block П is selected in an action 304. The code may be selected from a predetermined set of codes, comprising $2^N$ codes, where the respective codes are associated with different combinations of values of the N additional bits. For example, for N=2, there are four possible combinations of values of the two additional bits, i.e. [00, 01, 11, 10]. When N=2, the set of codes should comprise $2^N=4$ codes, where each of the four codes is associated with one of the combinations of values of the additional bits, i.e. associated with 00, 01, 11 or 10.

The term "code" embraces a set of codewords, which are representations of the code. For example, when b1=1 and b2=0, the code associated with the value combination 10 should be selected. The codes to be comprised in the set could be any linear codes, such as convolutional or LDPC codes. For example, the codewords of a first code in the set of codes may be obtained by permuting the bits of the codewords of a second code in the set, as previously described. However, the combination of any two of the codes, i.e. a code comprising the codewords of any two codes in the set of codes, would in general constitute a non-linear code The block of data, Π, is encoded by use of the selected code, in an action 306. After the encoding of the block, the block may be transmitted to a receiving node according to conventional methods. Thus, the additional bits may be conveyed to a receiving node in form of the selected code, which is used to encode the block of data.

Figure 4:
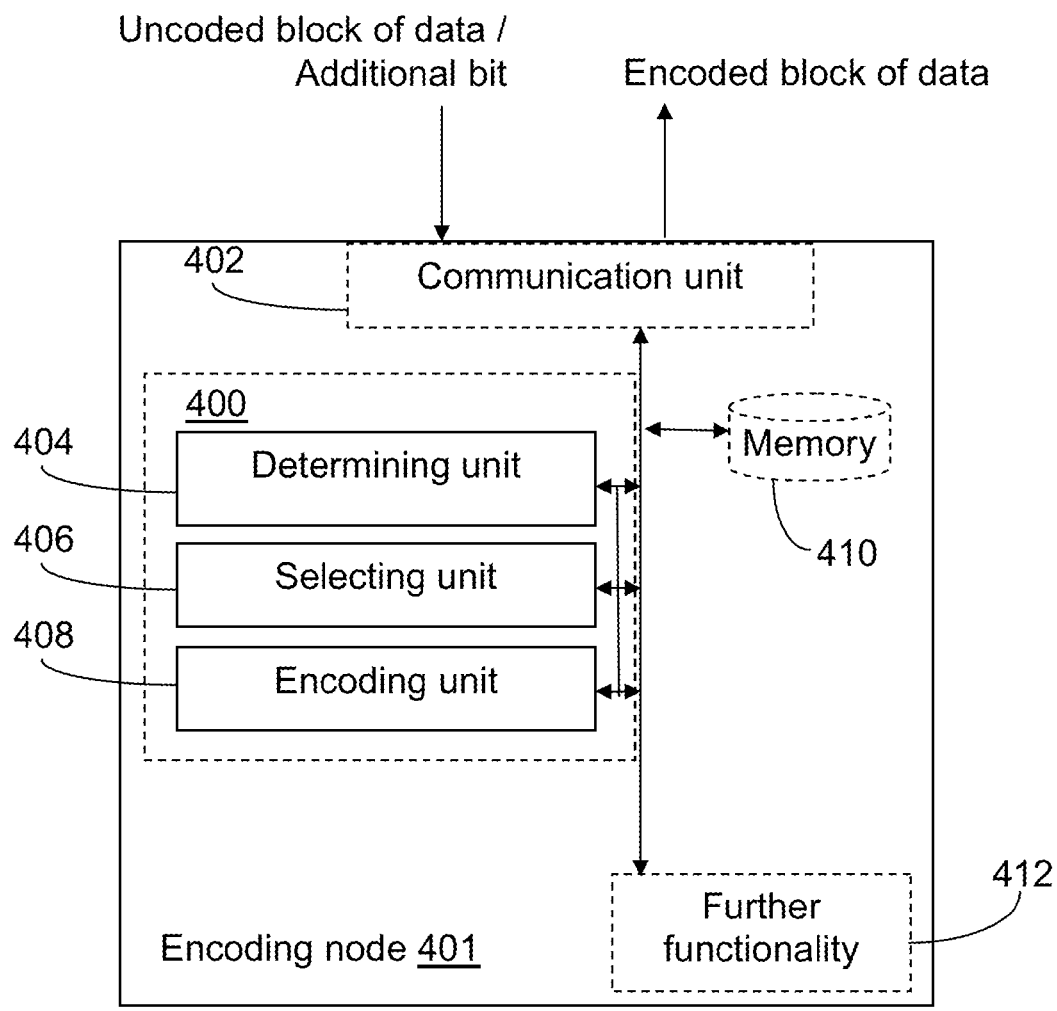
FIG. 4 is a block diagram illustrating an encoding node according to an exemplifying embodiment.

Exemplifying Encoding Node, FIG. 4

Below, an example encoding node 401 in a communication system will be described with reference to FIG. 4. The encoding node is adapted to enable the performance of the above described procedure of conveying N additional bits with a block of data, which is to be encoded and transmitted. As above, N is an integer ≥1, and each of the N additional bits is a binary digit, which may assume a value of zero or one.

The encoding node 401 may be a transmitting node in a cellular communication system, such as e.g. a base station/eNB, a mobile terminal or other communicating network node. The encoding node 401 is illustrated as to communicate with other entities via a communication unit 402 which may be considered to comprise conventional means for wireless and/or wired communication. The components or units in the encoding node, which are adapted to enable the performance of the above described procedure, are illustrated as to compose an arrangement 400, surrounded by a dashed line. The arrangement may be an encoder. The arrangement or encoding node may further comprise other functional units 412, such as e.g. functional units providing regular mobile terminal/base station functions, and may further comprise one or more storage units, e.g. memories 410.

The encoding node comprises a determining unit 404, which is adapted to determine the respective values of N additional bits to be conveyed with a packet of data, Π. The encoding node further comprises a selecting unit 406, which is adapted to select a code based on the determined N values. Further, the encoding node comprises an encoding unit 408, which is adapted to encode the block of data, Π, by use of the selected code.

The arrangement 400 could be implemented e.g. by one or more of: a processor or a micro processor and adequate software stored in a memory, to be executed by the processor; a Programmable Logic Device (PLD) or other electronic component(s)/processing circuit(s) configured to perform the actions mentioned above.

Figure 5:
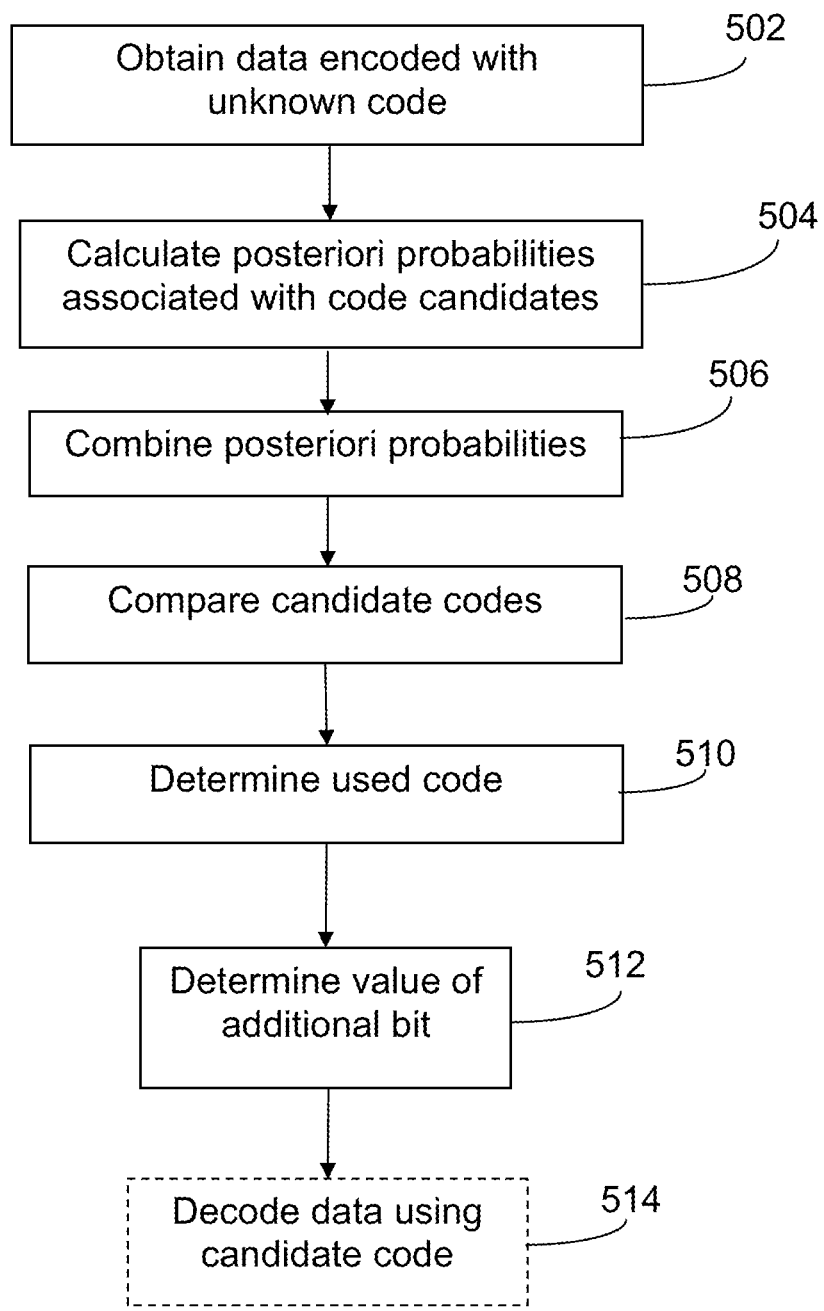
FIGS. 5-6 are flow charts illustrating the actions in procedures in a decoding node according to different exemplifying embodiments.
Figure 6:
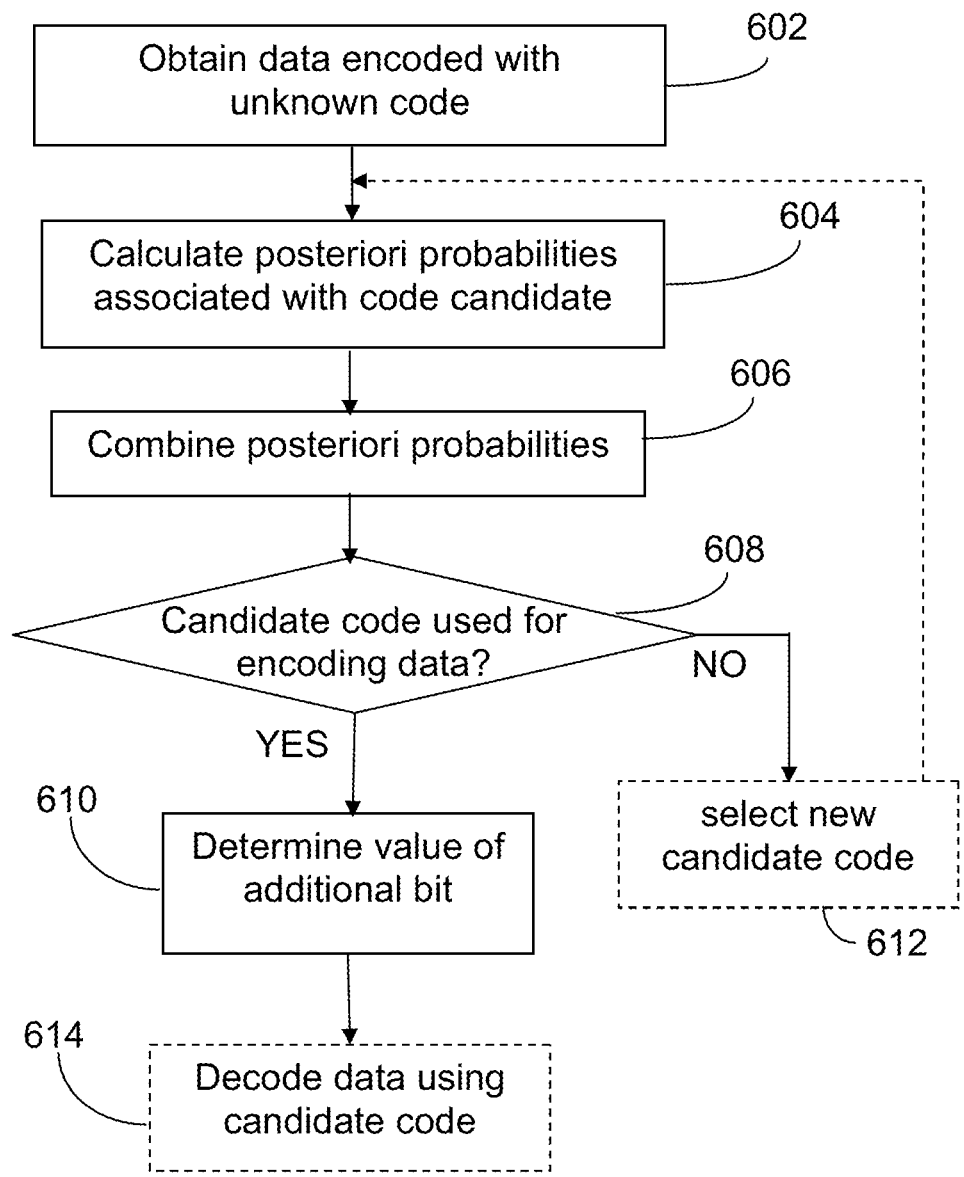

Exemplifying Procedure, FIG. 5-6

An embodiment of the procedure, in a decoding node in a communication system, for decoding of N additional bits conveyed with a block of data, will now be described with reference to FIGS. 5 and 6. As above, N is an integer ≥1, and each of the N additional bits is a binary digit, which may assume a value of zero or one. The decoding node could be a receiving node, such as e.g. a mobile terminal, base station/eNB or other communicating network node, in a communication system.

Assuming a block of data, Π, is received, e.g. in an action 502, which block Π is encoded by an unknown code, $C_U$. In an action 510, it is determined which code, from a predetermined set of candidate codes, that was used for encoding the block of data Π. The predetermined set of candidate codes comprises $2^N$ codes, associated with different possible combinations of values of the N additional bits. Then, the respective values of the N additional bits are determined based on the determined code, in an action 512. For example, for N=2, if it is determined that the unknown code, $C_u$, is the code $C_{01}$, comprised in the predetermined set, where $C_{01}$ is a code associated with the value combination, or values, 01 of the additional bits; it may be determined that the value of the additional bit b1 is 0 and the value of the additional bit b2 is 1.

The encoded block of data may then be decoded in an action 514, by use of the determined code. However, the decoding of the block Π is not mandatory, and further not necessary for determining the values of the N additional bits. There may be situations where it is not desired to decode the block Π.

The determining of the code, which was used for encoding the block Π, may involve calculating, in an action 504, the respective posterior probabilities that a set of syndrome checks are satisfied, given the obtained block of data. The syndrome checks may be associated with one or more code candidates from the set of codes. For example, the set of syndrome checks may comprise one or more syndrome checks associated with each of the code candidates. The determining may further involve combining the posterior probabilities, in an action 506. The posterior probabilities may be combined e.g. by adding the logarithms of the posterior probabilities for each individual syndrome check. The posterior probabilities may further be combined per code candidate. As mentioned above, it may be determined in an action 510, which of the code candidates that was used for encoding the block of data, based on the combined posterior probabilities. This could be determined e.g. by comparing the combined posterior probabilities associated with the different code candidates. Quantities based on or derived from the combined posterior probabilities associated with the different code candidates could also be compared. The candidate code used for encoding the block of data, could be identified e.g. by that the value(s) associated with this code stands out in the comparison, e.g. as being the largest value. The combining and determining may involve a statistical test, such as a Generalized Likelihood Ratio Test (GLRT). The GLRT may be obtained under the assumption that the logarithmic posterior probabilities have a Gaussian distribution.

It may further be determined e.g. whether an evaluated code candidate was used for encoding the block of data or not, based on the combined posterior probabilities. A procedure where one candidate code at a time is evaluated is illustrated in FIG. 6. The posteriori probabilities that a set of syndrome checks are satisfied, given an obtained block of data, are calculated in an action 604. In this embodiment, the set of syndrome checks comprises one or more syndrome checks associated with a code candidate to be evaluated. The posterior probabilities are combined, e.g. by adding the logarithms of the posterior probabilities associated with the code candidate, in an action 606. Further, it may be determined in an action 608, whether the candidate code was used for encoding the block of data or not. This could be determined e.g. by comparing the combined posterior probabilities, or a quantity based on or derived from the combined posterior probabilities, to a threshold. The threshold could be selected such that only the combined posterior probabilities, or quantity/ies derived from said probabilities, associated with the code used for encoding the block of data, will exceed (or fall below) the threshold. The combining and determining may involve a statistical test, such as a Generalized Likelihood Ratio Test (GLRT). The GLRT may be obtained under the assumption that the logarithmic posterior probabilities have a Gaussian distribution.

In the embodiment illustrated in FIG. 6, a new candidate code from the set of candidate codes is selected in an action 612, when it is determined in action 608 that an evaluated candidate code was not the used code. The candidate code selected in action 612 may then be evaluated by the actions 604-608, and the procedure ends when the used code has been found.

When the used code has been found, the value of the additional bit or bits is determined e.g. in an action 512 or 610. The values of the additional bits may be determined by that the values are associated with the used code, as previously described. The determining may be described as a de-mapping from a determined code to the value(s) of the additional bit(s). The block of data may be decoded, using the determined code, in an action 514 or 614.

Figure 7:
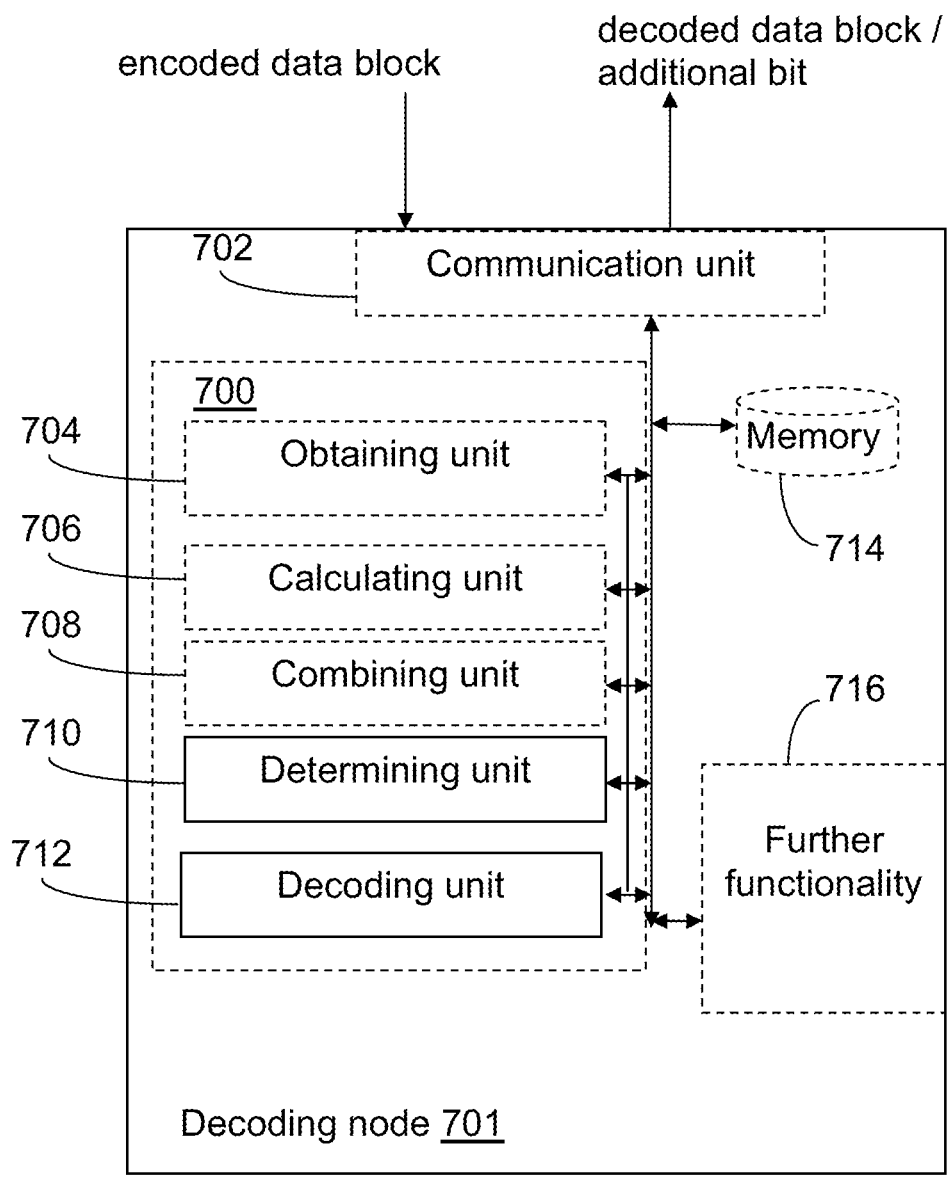
FIG. 7 is a block diagram illustrating a decoding node according to an exemplifying embodiment.

Exemplifying Decoding Node, FIG. 7

Below, an example decoding node 701 in a communication system will be described with reference to FIG. 7. The decoding node 701 is adapted to enable the performance of the above described procedure for decoding of N additional bits conveyed with a block of data. As above, N is an integer ≥1, and each of the N additional bits is a binary digit, which may assume a value of zero or one.

The decoding node 701 may be a receiving node in a cellular communication system, such as e.g. a base station/eNB, a mobile terminal or other communicating network node. The decoding node 701 is illustrated as to communicate with other entities via a communication unit 702 which may be considered to comprise conventional means for wireless and/or wired communication. The components or units in the decoding node, which are adapted to enable the performance of the above described procedure, are illustrated as to compose an arrangement 700, surrounded by a dashed line. The arrangement may be a decoder. The arrangement or decoding node may further comprise other functional units 716, such as e.g. functional units providing regular base station or mobile terminal functions, and may further comprise one or more storage units, e.g. memories 714.

In FIG. 6, the decoding node is illustrated as comprising an obtaining unit 704, adapted to receive an encoded block of data, which e.g. has been received over a radio channel by a receiver in the communication unit. The obtaining unit could alternatively be regarded e.g. as a part of the communication unit 702. The decoding node 701 comprises a determining unit 710, which is adapted to determine which code, from a predetermined set of candidate codes associated with different combinations of values of the N additional bits, that was used for encoding the block of data, and to determine the respective values of the N additional bits based on the determined code. The decoding node may further comprise a decoding unit 712, which is adapted to decode the block of data using the determined code.

The decoding node may further comprise a calculating unit 706, which is adapted to calculate the respective posterior probabilities that a set of syndrome checks are satisfied, given the obtained block of data. The decoding node may further comprise a combining unit 708, which is adapted to combine the posterior probabilities as described above, to support the determining of which candidate code that was used for encoding the block of data. The calculating unit 706 and the combining unit 708 may be integrated as part of the determining unit.

The decoding node is assumed to have been informed of the set of candidate codes and the bit values associated with each code. The decoding node is further assumed to have been provided with, have derived, or in any other way been given or have gained access to syndrome checks associated with the candidate codes. The information on codes and/or syndrome checks may have been provided e.g. by an OaM (Operations and Maintenance) node in the communication system, and may be stored in one or more memories.

The arrangement 700 could be implemented e.g. by one or more of: a processor or a micro processor and adequate software, stored in a memory, to be executed by the processor; a Programmable Logic Device (PLD) or other electronic component(s) or processing circuit(s), configured to perform the actions mentioned above.

Figure 8:
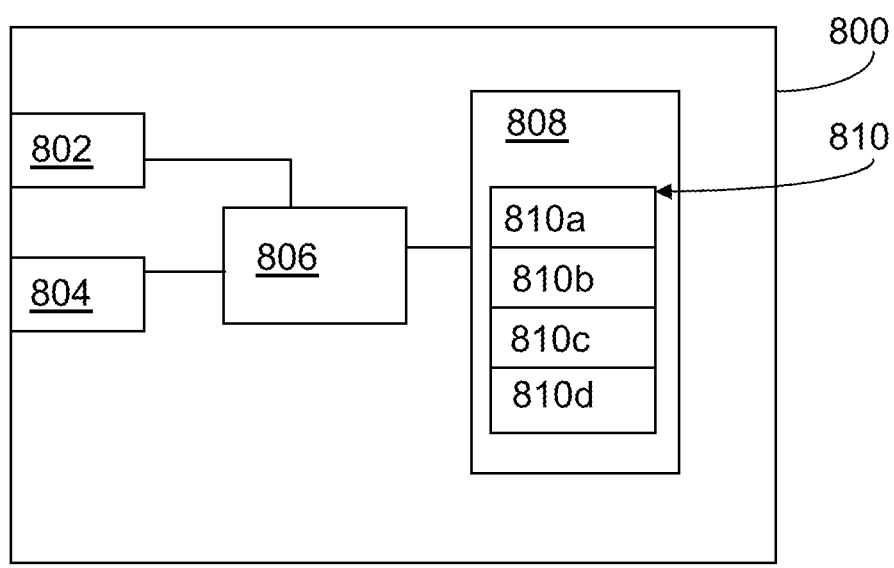
FIG. 8 is a block diagram illustrating a network node according to an exemplifying embodiment in a simplified manner.

Exemplifying Node, FIG. 8

FIG. 8 schematically shows an embodiment of an arrangement 8 in a network node, which also can be an alternative way of disclosing an embodiment of the arrangement in an encoding node illustrated in FIG. 4. Comprised in the arrangement 800 are here a processing unit 806, e.g. with a DSP (Digital Signal Processor). The processing unit 806 may be a single unit or a plurality of units to perform different actions of procedures described herein. The arrangement 800 may also comprise an input unit 802 for receiving signals from other entities, and an output unit 804 for providing signal(s) to other entities. The input unit 802 and the output unit 804 may be arranged as an integrated entity.

Furthermore, the arrangement 800 comprises at least one computer program product 808 in the form of a non-volatile memory, e.g. an EEPROM (Electrically Erasable Programmable Read-Only Memory), a flash memory and a hard drive. The computer program product 808 comprises a computer program 810, which comprises code means, which when executed in the processing unit 806 in the arrangement 800 causes the arrangement and/or the network node to perform the actions e.g. of the procedure described earlier in conjunction with FIG. 3.

The computer program 810 may be configured as a computer program code structured in computer program modules. Hence, in an exemplifying embodiment, the code means in the computer program 810 of the arrangement 800 comprises a determining module 810a for determining the values of N additional bits to be conveyed with a block of data. The computer program further comprises a selecting module 810b for selecting a code based on the N determined values. The computer program 810 further comprises an encoding module 810c for encoding the block of data by use of the selected code. The computer program 810 could further comprise other modules for providing other desired functionality.

The modules 810a-c could essentially perform the actions of the flow illustrated in FIG. 3, to emulate the arrangement in an encoding node illustrated in FIG. 4. In other words, when the different modules 810a-c are executed in the processing unit 806, they may correspond to the units 404-408 illustrated in FIG. 4.

Although the code means in the embodiment disclosed above in conjunction with FIG. 8 are implemented as computer program modules which when executed in the processing unit causes the arrangement and/or encoding node to perform the actions described above in the conjunction with figures mentioned above, at least one of the code means may in alternative embodiments be implemented at least partly as hardware circuits.

The processor may be a single CPU (Central processing unit), but could also comprise two or more processing units. For example, the processor may include general purpose microprocessors; instruction set processors and/or related chips sets and/or special purpose microprocessors such as ASICs (Application Specific Integrated Circuit). The processor may also comprise board memory for caching purposes. The computer program may be carried by a computer program product connected to the processor. The computer program product may comprise a computer readable medium on which the computer program is stored. For example, the computer program product may be a flash memory, a RAM (Random-access memory) ROM (Read-Only Memory) or an EEPROM, and the computer program modules described above could in alternative embodiments be distributed on different computer program products in the form of memories within the network node.

In a similar manner, an exemplifying embodiment comprising computer program modules could be described for the arrangement in a decoding node illustrated in FIG. 7.

It is to be understood that the choice of interacting units or modules, as well as the naming of the units are only for exemplifying purpose, and nodes suitable to execute any of the methods described above may be configured in a plurality of alternative ways in order to be able to execute the suggested process actions.

It should also be noted that the units or modules described in this disclosure are to be regarded as logical entities and not with necessity as separate physical entities.

The invention claimed is:

1. A method, in an encoding node in a communication system, of conveying N additional bits with a block of data to be encoded and transmitted, the method comprising:
    determining respective values of the N additional bits;
    selecting a block code based on the N values;
    encoding the block of data by use of the block code selected; and
    conveying sequentially the N additional bits with the block of data,
    wherein N is an integer ≥ 1, and each of the N additional bits is a binary digit having a value of zero or one and wherein at least one of the N additional bits is related to at least one of control signaling and acknowledgements in an automatic repeat request procedure.

2. The method of claim 1, wherein the block code is selected from a predetermined set comprising 2N block codes, respectively associated with different combinations of values of the N additional bits.

3. The method of claim 2, wherein the predetermined set comprises at least one pair of block codes, and codewords of a first block code in the at least one pair are obtained by permuting bits of codewords of a second block code in the at least one pair.

4. An encoding node for a communication system for conveying N additional bits with a block of data to be encoded and transmitted, the encoding node comprising:
    a determining unit adapted to determine respective values of the N additional bits;
    a selecting unit adapted to select a block code based on the N values;
    an encoding unit adapted to encode the block of data by use of the block code selected; and
    an output unit adapted to convey sequentially the N additional bits with the block of data,
    wherein N is an integer ≥ 1, and each of the N additional bits is a binary digit having a value of zero or one and wherein at least one of the N additional bits is related to at least one of control signaling and acknowledgements in an automatic repeat request procedure.

5. The encoding node of claim 4, wherein the selecting unit is adapted to select the block code from a predetermined set comprising 2N block codes, respectively associated with different combinations of values of the N additional bits.

6. The encoding node of claim 5, wherein the predetermined set comprises at least one pair of block codes, and codewords of a first block code in the at least one pair are obtained by permuting bits of codewords of a second block code in the at least one pair.

7. A method, in a decoding node in a communication system, of decoding N additional bits conveyed with a block of data, the method comprising:
    receiving sequentially the N additional bits with the block of data;
    determining which block code of a predetermined set of candidate block codes associated with different possible combinations of values of the N additional bits was used for encoding the block of data; and
    determining respective values of the N additional bits based on the block code determined;
    wherein N is an integer ≥ 1, and an additional bit is a binary digit having a value zero or one and wherein at least one of the N additional bits is related to at least one of control signaling and acknowledgements in an automatic repeat request procedure.

8. The method of claim 7, further comprising decoding the block of data using the block code determined.

9. The method of claim 8, wherein the respective values of the N additional bits are determined before decoding the block of data.

10. The method of claim 7, wherein determining which block code was used comprises:
    obtaining a block of data encoded with an unknown block code of a predetermined set of block codes;
    calculating respective posterior probabilities that a set of syndrome checks are satisfied, given the block of data obtained, the syndrome checks being associated with a block code candidate of the set of block codes; and
    combining the posterior probabilities, thereby enabling determining whether the block code candidate was used for encoding the block of data obtained based on the posterior probabilities combined.

11. The method of claim 10, wherein posterior probabilities are calculated for a second set of syndrome checks associated with at least one further block code candidate.

12. The method of claim 11, wherein the respective posterior probabilities are combined per block code candidate.

13. The method of claim 12, further comprising determining which block code candidate was used for encoding the block of data obtained based on comparison between combined posterior probabilities associated with each block code candidate.

14. The method of claim 12, wherein combining posterior probabilities includes adding logarithms of the posterior probabilities for each syndrome check.

15. A decoding node in a communication system for decoding N additional bits conveyed with a block of data, the decoder comprising:
    an obtaining unit adapted to receive sequentially the N additional bits with the block of data; and
    a determining unit adapted to determine which block code of a predetermined set of candidate block codes associated with different combinations of values of the N additional bits was used for encoding the block of data, and to determine respective values of the N additional bits based on the block code determined;
    wherein N is an integer ≥ 1, and each of the N additional bits is a binary digit having a value of zero or one and wherein at least one of the N additional bits is related to at least one of control signaling and acknowledgements in an automatic repeat request procedure.

16. The decoding node of claim 15, further comprising a decoding unit adapted to decode the block of data using the block code determined.

17. The decoding node of claim 16, wherein respective values of the N additional bits are determined before the block of data is decoded.

18. The decoding node of claim 15, further comprising:
   an obtaining unit adapted to obtain a block of data encoded with an unknown block code of a predetermined set of block codes;
   a calculating unit adapted to calculate respective posterior probabilities that a set of syndrome checks are satisfied given the block of data obtained, the syndrome checks being associated with a block code candidate from the set of block codes; and
   a combining unit adapted to combine the posterior probabilities, thereby enabling determining whether the block code candidate was used for encoding the block of data obtained based on the combined posterior probabilities.

19. The decoding node of claim 18, wherein the calculating unit is adapted to calculate posterior probabilities for a second set of syndrome checks associated with at least one further block code candidate.

20. The decoding node of claim 19, wherein the combining unit is adapted to combine respective posterior probabilities per block code candidate.

21. The decoding node of claim 20, wherein the determining unit is adapted to determine which block code candidate was used for encoding the block of data obtained based on comparison between combined posterior probabilities associated with each block code candidate.

22. The decoding node of claim 18, wherein the combining unit is adapted to combine the posterior probabilities by adding logarithms of the posterior probabilities for each syndrome check.

23. A method in a communication system of conveying N additional bits with a block of data to be encoded and transmitted, the method comprising:
   in an encoding node:
      determining respective values of the N additional bits;
      selecting a block code based on the respective values;
      encoding the block of data by use of the block code selected; and
      conveying sequentially the N additional bits with the block of data; and
   in a decoding node:
      receiving sequentially the N additional bits with the block of data;
      determining which block code of a predetermined set comprising 2N candidate block codes associated with different combinations of values of the N additional bits was used for encoding the block of data; and
      determining respective values of the N additional bits based on the block code determined;
   wherein N is an integer ≥ 1, and an additional bit is a binary digit having a value zero or one, whereby values of the N additional bits are determined in the decoding node without decoding the block of data and wherein at least one of the N additional bits is related to at least one of control signaling and acknowledgements in an automatic repeat request procedure.

24. A non-transitory computer-readable medium containing instructions that, when executed by the computer, cause the computer to carry out a method, in an encoding node in a communication system, of conveying N additional bits with a block of data to be encoded and transmitted, wherein the method comprises:
   determining respective values of the N additional bits;
   selecting a block code based on the N values;
   encoding the block of data by use of the block code selected; and
   conveying sequentially the N additional bits with the block of data,
   wherein N is an integer ≥ 1, and each of the N additional bits is a binary digit having a value of zero or one and wherein at least one of the N additional bits is related to at least one of control signaling and acknowledgements in an automatic repeat request procedure.

25. A non-transitory computer-readable medium containing instructions that, when executed by the computer, cause the computer to carry out a method, in a decoding node in a communication system, of decoding N additional bits conveyed with a block of data, wherein the method comprises:
   receiving sequentially the N additional bits with the block of data;
   determining which block code of a predetermined set of candidate block codes associated with different possible combinations of values of the N additional bits was used for encoding the block of data; and
   determining respective values of the N additional bits based on the block code determined;
   wherein N is an integer ≥ 1, and an additional bit is a binary digit having a value zero or one and wherein at least one of the N additional bits is related to at least one of control signaling and acknowledgements in an automatic repeat request procedure.

* * * * *